TAPERED-SHELF SEMICONDUCTOR

Filed June 28, 1967 2 Sheets-Sheet 1

INVENTOR.
WERNER A. SCHÜLER
BY Brumbaugh, Free, Graves & Donohue
his ATTORNEYS

INVENTOR.
WERNER A. SCHÜLER
BY Brumbaugh, Free, Graves & Donohue
his ATTORNEYS

United States Patent Office 3,501,678

Patented Mar. 17, 1970

3,501,678

TAPERED-SHELF SEMICONDUCTOR

Werner A. Schüler, Austin, Tex., assignor to Ortec, Oak Ridge, Tenn., a corporation of Tennessee Filed June 28, 1967, Ser. No. 649,622
Int. Cl. H01l 15/00
U.S. Cl. 317—234 1 Claim

ABSTRACT OF THE DISCLOSURE (1) A semiconductor in which the intrinsic or depletion region is formed with a tapered annular shelf.

(2) A method of forming the tapered shelf by diffusing dope from a dope source into the semiconductor nonuniformity to form a P-N junction prior to applying reverse bias to the junction.

(3) Apparatus for practicing the method in which a tube extending between the dope source and the semiconductor facilitates heavy deposition of dope on the semiconductor in a region near the mouth of the tube and progressively lighter deposition at locations radially removed from such region.

(4) A method of using the semiconductor to detect radiation.

BACKGROUND OF THE INVENTION

Field of the invention

This invention relates to semiconductors and, more particularly, to improved semiconductors in which the conducting channel or layer which tends to form between P and N regions on the surface of semiconductors subjected to reverse bias is "pinched off" by an electrostatic field having, by virtue of the structure of the semiconductors, a large component normal to the surface. The invention also relates to a method and apparatus facilitating manufacture of the improved semiconductors and to a method of using the semiconductors to measure radiation.

Description of the prior art

A persistent problem associated with semiconductors has been the conducting layer or channel, generally N-type, which tends to form on the surface of the I region of P-I-N semiconductors, and on the surface of the depletion region of P-N semiconductors, subjected to reverse bias (i.e., to a positive voltage applied to the N region and a negative voltage applied to the P region).

Under reverse bias above a certain value called the breakdown voltage, a semiconductor conducts readily, of course, because (a) thermally-generated carrier pairs acquire sufficient energy from the strong electrostatic field to produce other carrier pairs on collision with adjacent atoms by an avalanche process, or (b) the electrostatic field generates carrier pairs by stripping electrons from the atoms of the crystal. If, however, the reverse bias is less than the breakdown voltage then, when the depletion region has grown to the point where the back voltage between the separated carriers equals the voltage supplied by the external D.C. source, a condition attained in a few millionths of a second, conduction ideally ceases, because there are ideally no carriers of current in the depletion region.

In practice, however, there is a tendency under reverse bias, even though the reverse bias is substantially less than the breakdown voltage, for the intrinsic or depletion region, particularly if the semiconductor is not cooled, to develop a conducting surface layer, generally N-type. Although, as J. Llacer points out in "Study of Surface Effects in Thick Lithium Drifted Silicon Radiation Detectors," IEEE Trans. Nucl. Sci. NS–11, # 3, June 1964, pages 221–231, there is no completely satisfactory theory explaining the mechanism responsible for surface effects, it is clear that a conducting surface layer does tend to form and that it causes an increase in leakage current (and hence noise) above a certain reverse bias substantially less than the breakdown voltage.

In many applications, a relatively high reverse bias is desired. For example, in radiation detection, a high reverse bias is desired in order to achieve a short collection time so that substantially all carrier pairs generated in the intrinsic or depletion region by incident radiation are collected rather than permitted to recombine (to the extent they are permitted to recombine, resolution of the energy of a unit of incident radiation is degraded).

In order to achieve both high voltage and low noise in the case of a P-I-N semiconductor, it has been proposed to treat chemically the surface of the I region to eliminate N-type conductivity. The results have not been completely satisfactory. If the surface is made too positive, substantially all the voltage drop occurs in a very small distance between the I and N regions and the potential gradient over this distance is so steep that breakdown occurs at unacceptably low voltages.

In BNL 9535, Llacer proposed increasing the resistivity of the surface of the I region of a P-I-N semiconductor subjected to reverse bias by an increase in the component of the electrostatic field normal to the surface of the I region, and R. Lothrop and S. Goulding, in UCRL 16718, proposed that, to this end, the I region be formed on its outer periphery with an annular shelf adapted to pinch off the N-type channel by warping the electrostatic field in the I region. They also proposed a double drift method for achieving the desired structure.

These expedients, while useful, also fail to provide a complete solution to the problem of surface leakage currents, because the proposed geometry of the I region is difficult to achieve and in any case results in too weak an electrostatic field in the shelf at low reverse bias.

Finally, a patent to Shockley No. 2,672,528 disclosed a P-N signal-translating device having a tapered P region, but the disclosure is not directed to problems encountered with radiation detectors nor to semiconductors of the P-I-N type.

SUMMARY OF THE INVENTION

It is an object of the present invention to remedy the problems outlined above. More particularly, an object of the invention is to provide semiconductors characterized by exceptionally low leakage current when subjected to reverse bias. A further object of the invention is to provide a method and apparatus facilitating efficient and economical manufacture of the improved semiconductors and a method of employing the semiconductors to measure radiation.

In attaining the foregoing and other objects in accordance with the invention, the I region of a P-I-N semiconductor or the depletion region of a P-N semiconductor under reverse bias is formed with an annular shelf that is tapered in a prescribed manner. Specifically, the shelf tapers from a maximum thickness at the portion thereof adjoining the remainder of the I or depletion region to a minimum thickness at the portion thereof remote from the remainder of the I or depletion region.

In making the semiconductor in accordance with the method of the invention, the tapered annular shelf is formed by diffusion of dope nonuniformly into a semiconductor to form a P-N junction in the semiconductor. At use temperature, application of reverse bias to the junction is adapted to form in the semiconductor a depletion region of the prescribed configuration between P and N regions. At drifting temperature, a single application of reverse bias to the junction is adapted to produce nonuniform drifting of the dope and form in the semiconductor an I region of the prescribed configuration between P and N regions. Dope from a dope source is deposited on the surface of the semiconductor nonuniformly in facilitation of the nonuniform diffusion.

Apparatus constructed in accordance with the invention facilitates deposition of dope from a dope source onto a semiconductor nonuniformly for diffusion thereinto. Means mounted between the dope source and the semiconductor channels movement of the dope from the source to the semiconductor so that the concentration of dope on the semiconductor is relatively heavy in a selected region and progressively lighter at locations radially moved from such region.

Under reverse bias, the semiconductor functions as a radiation detector.

BRIEF DESCRIPTION OF THE DRAWING

For an understanding of additional aspects of the invention, reference may be made to the following detailed description of preferred embodiments thereof and to the accompanying figures of the drawing, in which.

DESCRIPTION OF THE PREFERRED EMBODIMENTS

Figures 1, 2, 3:
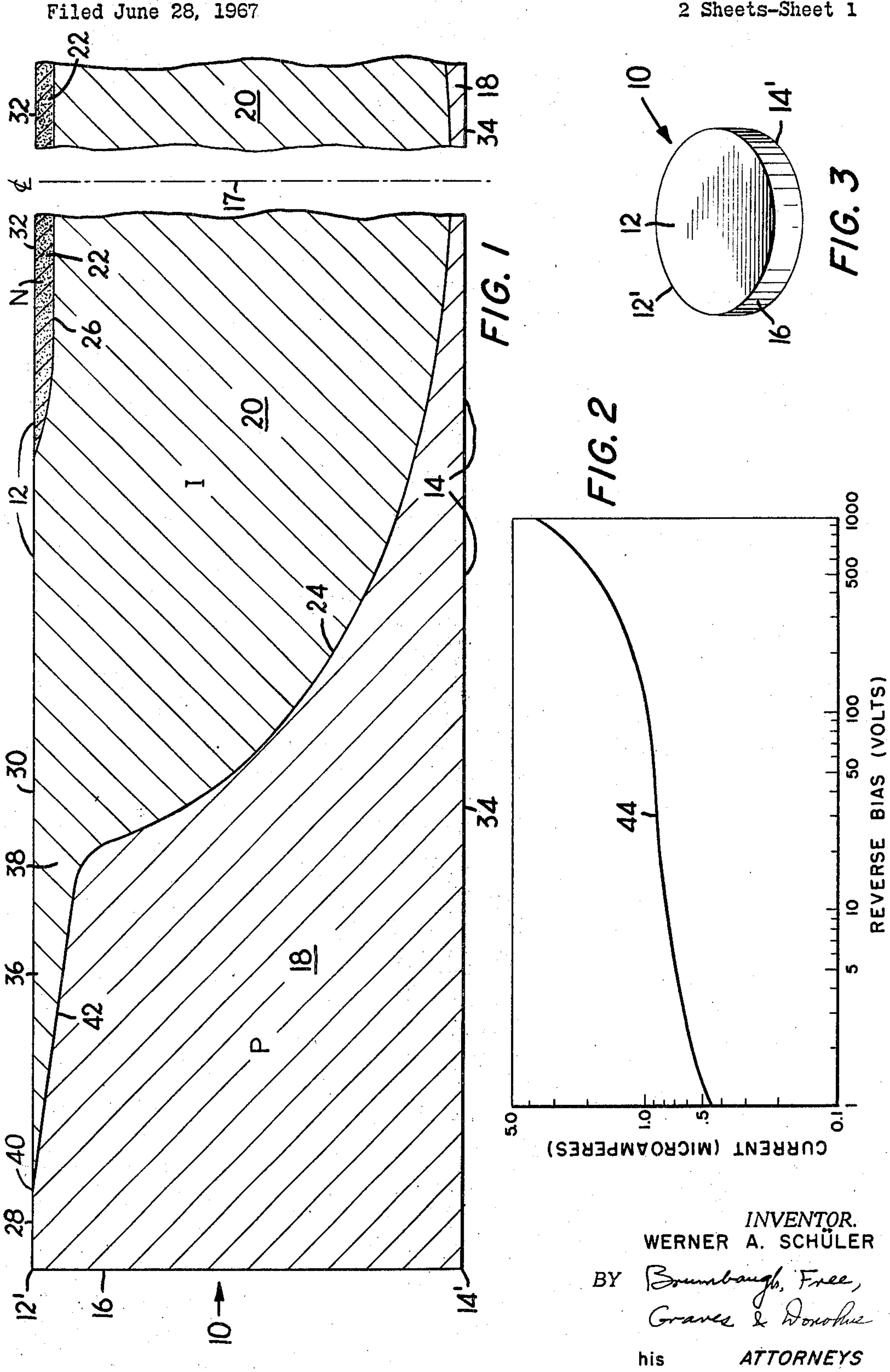
FIG. 1 is a greatly enlarged fragmentary axial section of an exemplary disk-shaped semiconductor wafer in accordance with the invention.
FIG. 2 is a graph showing important performance characteristics of the semiconductor of FIG. 1.
FIG. 3 is a perspective view on a scale smaller than that of FIG. 1 of a disk-shaped semiconductor wafer adapted for use in the practice of the method of the invention.

FIG. 1 shows on a greatly enlarged scale an exemplary embodiment of a semiconductor device 10 constructed in accordance with the invention. The semiconductor device 10 may have any desired shape but for purposes of illustration is shown in the form of a disk-shaped wafer having a circular face 12 on one side thereof, a circular face 14 on the opposite side thereof, and a wall 16 forming a circular intersection 12' with the circular face 12 and a circular intersection 14' with the circular face 14. The wall 16 extends between the circular walls 12 and 14 and is cylindrically curved about an axis 17. See also FIG. 3, which shows a wafer-shaped semiconductor device 10 in perspective. Inasmuch as the semiconductor device 10 is symmetrical about the axis 17, only part of the semiconductor device 10 is illustrated in FIG. 1. This permits the use of a scale sufficiently large to show the structure in detail.

The semiconductor device 10 is of the P-I-N type. That is, the semiconductor device 10 includes a P or positive-carrier region 18—a region in which the majority carriers of electric current are holes (which are conventionally regarded as positive in sign), an N or negative-carrier region 22—a region in which the majority carriers of electric current are electrons (which are conventionally regarded as negative in sign)—and an I or intrinsic region 20—a region in which the number of holes and the number of electrons are substantially equal and in which holes and electrons participate substantially equally as carriers of electric current. The P region 18 and I region 20 form a first interface 24, and the I region 20 and the N region 22 form a second interface 26.

One circular surface 12 of the semiconductor device 10 is defined by an annular surface 28 of the P region 18, an annular surface 30 of the I region 20, and a circular surface 32 of the N region 22. The other circuit surface 14 of the semiconductor wafer 10 is defined at least in part by the surface 34 of the P region 18. In one embodiment (not illustrated), providing a thin window for detection of incident radiation, the I region 20 defines the central portion of the circular face 14. The design of this portion of the semiconductor may be varied within wide limits.

In accordance with the invention, the interface 24 of the P region 18 and I region 20 is specially formed to "pinch off" the N-type surface conducting channel which would otherwise tend to form on the surface 30 of the I region 20 between the P region 18 and the N region 22 under reverse bias. Specifically, a tapered annular shelf 36 is formed on the outer periphery of the I region 20. The thickness of the annular shelf 36 measured in a direction parallel to the axis 17 decreases from a maximum value along a cylindrical path 38 where the annular shelf 36 adjoins the remainder of the I region 20 to a minimum value which is negligible at a circle 40 of intersection of the interface 24 and surface 12. The preferred axial thickness of the N region is about 0.1 millimeter, or a little less than the preferred axial thickness of the annular shell in the path 38. In certain embodiments (not shown), the interface 24 does not form a "dogleg" (as seen in the section of FIG. 1) in the vicinity of the path 38. Obviously, many configurations of the interface 24 are consistent with the invention.

The slope of the portion 42 of the interface 24 between the P region 18 and I region 20 with respect to the surface 12 of the semiconductor wafer 10 is shallow; i.e., the interface 24 intersects the surface 12 of the semiconductor wafer 10 at a small angle. In accordance with the invention, the angle must be substantially smaller than 90° and for best results should be as small as possible. In the preferred embodiment of the invention illustrated, the angle is of the order of 8°.

The result of the structure illustrated in FIG. 1 is that the electrostatic field existing between the N region 22 and the P region 18 when the semiconductor device 10 is subjected to a reverse bias is warped in such a manner as to "pinch off" the N-type surface conducting channel which would otherwise tend to form on the surface 30 of the I region 12.

For an understanding of this effect, it must be appreciated that the P and N regions of a semiconductor have relatively high conductivity, while the I region has relatively low conductivity. Electrostatic lines of force between two relative conductors through a relative insulator sandwiched therebetween tend to be normal to the interfaces of the insulator with the conductors. Thus, in the tapered annular shelf 36, the electrostatic lines of force, which are normal to the portion 42 of the interface 24 of the P region 18 and the I region 20, are also nearly normal to the surface 12 of the semiconductor device 10. That is, the electrostatic lines of force have a large component normal to the surface 12 in the vicinity of the tapered shelf 36 and a small component tangential to the surface 12 in the vicinity of the tapered shelf 36. As a result, the electrostatic field does not drive significant numbers of carriers between the P region 18 and the N region 22 over the surface 30 of the intrinsic region 20, and the conducting surface channel between the N region 22 and the P region 18 is effectively "pinched off."

FIG. 2 is a graph showing important performance characteristics of a semiconductor wafer constructed in accordance with the invention and adapted for radiation detection. The graph shows by a curve 44 leakage current as a function of reverse bias of a semiconductor wafer of which the base semiconductor material is silicon, the P region is boron-doped, and the N region is lithium-doped, and which has a thickness of 3 millimeters and an active area of 200 square millimeters. The ordinates of the curve 44 represent current in microamperes and the abscissae reverse bias in volts. Both the ordinates and the abscissae are on a logarithmic scale (base 10).

Compared to analogous data given in Lothrop and Goulding, UCRL 16718, the data of FIG. 2 suggest the superiority of a semiconductor constructed in accordance with the present invention. In particular, for reverse bias ranging from about 10 volts to 1,000 volts, the device of the present invention exhibits a significantly lower leakage current than do the prior-art devices. This is of great significance in applications such as radiation detection where high reverse bias (to facilitate collection of substantially all carriers generated by incident radiation before they have an opportunity to recombine) and high signal-to-noise ratio are desired.

It is particularly noteworthy that the taper of the shelf means that the distance thereacross is so short at the outer extremity thereof that, regardless of how low the applied voltage may be, the potential gradient thereacross is appreciable. This means that the desired "pinching" is effective even at low voltages.

Figure 4:
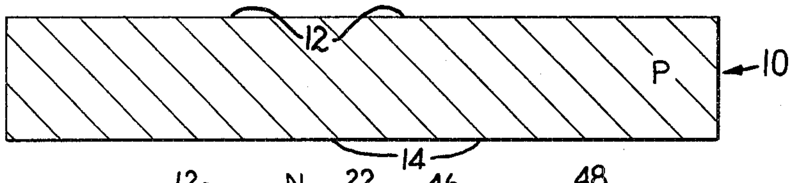
FIGS. 4–6 are axial sections on a scale intermediate the scales of FIGS. 1 and 3 of the semiconductor of FIG. 3 showing successive steps in the method of the invention for the manufacture of the semiconductor of the invention.
Figure 5:
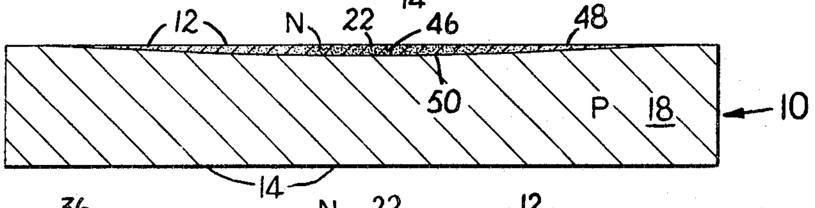
Figure 6:
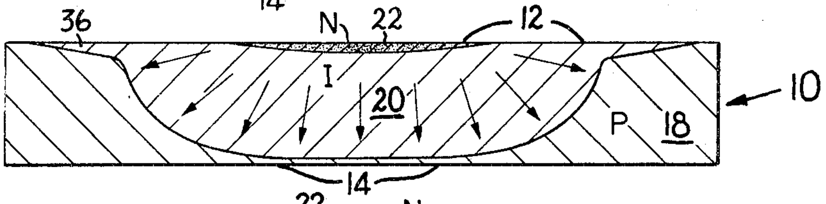

FIG. 4–6 illustrate successive steps of a preferred method in accordance with the present invention of making the novel semiconductor of FIG. 1.

FIG. 4 shows a P-type commercially-available semiconductor wafer 10 which may be, for example, a boron-doped silicon crystal of the type shown in perspective in FIG. 3.

FIG. 5 shows the step of nonuniformly diffusing a dope such as lithium (which donates electrons to the lattice of a silicon crystal into which it is diffused and tends to render the portion of the silicon crystal into which it is diffuse N-type) into the P-type crystal 10. The resulting N region 22 forms a P-N junction 50 with the P region 18. The lithium is in higher concentration in the central portion 46 of the N region 22 than in the peripheral portions 48 of the N region 22, and the P-N junction is therefore convex downward as seen in the figure.

The nonuniform diffusion is effected in accordance with the invention by a nonuniform initial deposition of the lithium on the surface 12 of the semi-conductor wafer 10. For example, a relatively high concentration, say $10^{15}$ atoms of lithium per square centimeter, may be deposited on a selected portion of the surface 12 of the semiconductor wafer 10 such as a portion centered on the axis 17 (FIG. 1) of the wafer and progressively lighter concentrations of lithium, down to a concentration of about $10^{12}$ atoms of lithium per square centimeter, may be deposited on portions of the surface 12 of the semiconductor 10 radially removed from the selected center portion.

FIG. 6 shows the manner in which lithium diffused in a silicon semiconductor wafer 10 as shown in FIG. 5 drifts when subjected to a reverse bias across the P-N junction 50 shown in FIG. 5. To facilitate the drifting step, an area of several millimeters in diameter in the center of the region directly evaporated with lithium and the whole of the other side 14 of the wafer may be covered with a layer of evaporated gold (not shown) serving as electrodes. When the desired depth of the intrinsic region has been attained by the drifting, the wafer is removed and undergoes standard treatments which are known in the art and cited, for example, by Lothrop and Smith in UCRL 16190. The side 12 of the wafer 10 into which the lithium was diffused may be lightly relapped with No. 9 lapping compound and etched for 30 seconds to remove damaged or improperly drifted surface layers.

Those skilled in the art understand that, to perform the drifting step, a positive voltage is applied to the N region 22 and a negative voltage is applied to the P region 18, as disclosed in a patent to Pell No. 3,016,313. The lithium atoms are ionized, having given up their valence electrons to the silicon lattice, and hence carry a positive charge, which means that they are repulsed by the positive voltage applied to the N region 22. The temperature of the semiconductor is controlled as necessary (silicon crystals generally must be heated to facilitate drifting, while germanium crystals generally must be provided with cooling means to prevent overheating during the drifting step). The shape and thickness of the tapered shelf are a function of temperature, diffusion time, and a geometry factor and depend also on the total amount of lithium evaporated and on the fact that the outer portion of the semiconductor "runs out" of lithium during the drift so that a source-limited drift is effected therein.

Figure 7:
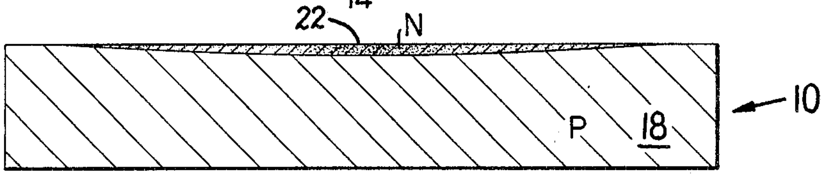
FIG. 7 is an axial section on the scale of FIGS. 4–6 of an alternate embodiment of a semiconductor wafer adapted for use as a radiation detector in accordance with the invention.
Figure 8:
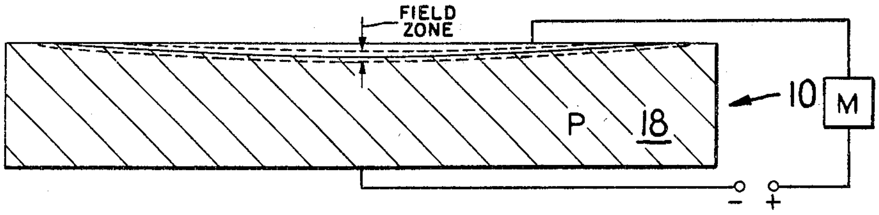
FIG. 8 is an axial section of the semiconductor wafer of FIG. 7 when subjected to a reverse bias and a schematic of electrical circuitry used in conjunction with the semiconductor to measure incident radiation.

FIGS. 7 and 8 shows the structure of a P-N semiconductor adapted for use in radiation detection in accordance with the invention. In this case, however, the field zone (FIG. 8) is not an intrinsic region but a depletion region under reverse bias. Those skilled in the art will understand that whether the reverse bias produces an instrinsic region or a depletion region depends on whether the semiconductor device during application of the reverse bias is at drift temperature (in which case the region 20 is rendered intrinsic) or use temperature (in which case the field zone is a depletion region).

FIG. 8 also shows schematically the application of reverse bias to the semiconductor (positive voltage applied to the N region and negative voltage applied to the P region) and the measurement by means M of a pulse generated by radiation incident on the crystal.

In accordance with the present invention, the concentration of lithium in a selected portion of the N region 22 significantly exceeds the concentrations at remaining portions of the N region 22. The selected portion (which is symmetrical about the axis 17 in the illustrated method) drifts much more deeply than the remaining portions, the latter "running out" of lithium during the drift so that a source-limited drift is effected therein. For reasons understood by those skilled in the art, drifting proceeds only in regions where an electrostatic field exists and hence in such a manner as to produce an expanding intrinsic region (i.e., in the case of a silicon crystal doped with boron and lithium, a region in which the concentration of lithium equals the concentration of boron). Concurrently, the N region 22 shrinks somewhat, particularly in portions thereof initially relatively sparsely populated with lithium ions, as the lithium ions drift in the directions indicated by the arrows in FIG. 6.

It will be observed that the drifting of the lithium ions (FIG. 6) is to some extent radially outward from the axis 17 (FIG. 1) of the semiconductor. It is therefore necessary to insure that the shelf 36 is not overgrown by the intrinsic region 20. This means that the shelf must extend a distance from the axis 17 greater than a distance equal to the radius of the heavily-doped N region 22 plus the thickness of the I region 20 of the finished device.

Figure 9:
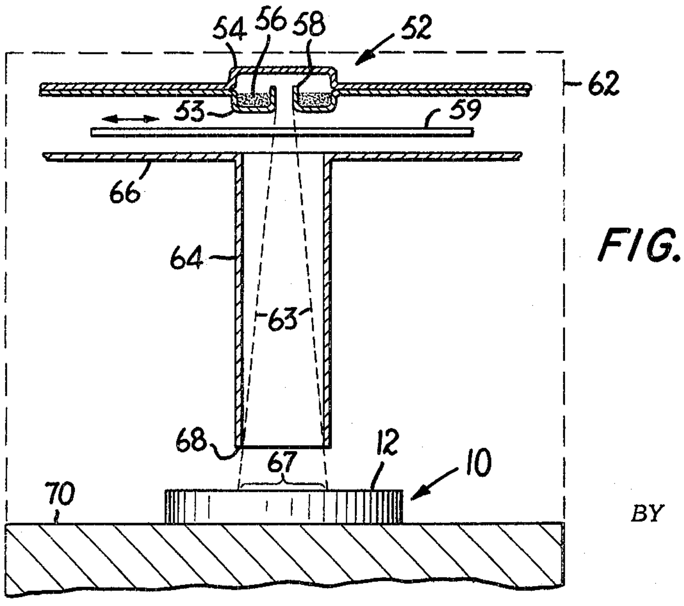
FIG. 9 is a partly-sectional view in elevation of apparatus in accordance with the invention for practicing the manufacturing method of the invention.

FIG. 9 shows apparatus constructed in accordance with the invention for practicing the manufacturing method of the invention disclosed above. In the apparatus of FIG. 9, a source such as a boat 52, which may be made of suitable material such as tantalum or molybdenum, is provided with a lid 54. Within the boat 52, a dope such a lithium 56 is contained. The bottom 53 of the boat 52 is formed with a cylindrical weir 58 so that lithium 56 evaporated by heat electrically generated by a heat source (not shown) and impinging on the lid 54 is reflected downwardly onto the surface 12 of the lithium wafer 10 in a manner described hereinafter. A shutter 59 movable in the directions indicated by the double-headed arrow initially intercepts matter evaporated from the boat 52 in order to prevent contaminants from reaching the wafer 10. When the lithium 56 is clean, the shutter 59 is removed.

The entire apparatus is enclosed in means such as a bell jar 62 within which a vacuum may be established and maintained by vacuum-producing means such as a vacuum pump (not shown). Thus, Brownian movement does not significantly characterize the passage of the evaporated lithium atoms from the source 52 to the semiconductor wafer 10, and the lithium atoms can move to the wafer 10 in either of two ways. Those lithium atoms having a trajectory upon leaving the boat 52 within a solid angle defined by the dotted lines 63 are deposited directly (i.e., without undergoing further reflection) upon a circular area 67 of the surface of the wafer 10. The circular area 67 lies within the closed intersection of the surface 12 of the wafer 10 with the boundary of the solid angle defined by dotted lines 63 tangent to the mouth 68 of the tube 64. Lithium atoms which leave the boat 52 with a trajectory falling outside the solid angle defined by the dotted lines 63 can reach the semiconductor wafer 10 only by undergoing one or more reflections from the wall of a tube 64. The tube 64 is provided with a shield 66 inserted between the boat 52 and the semiconductor wafer 10 and preventing lithium atoms from reaching the wafer 10 except through the tube 64.

Those lithium atoms that are reflected from the wall of the tube 64 can impinge on the surface 12 of the wafer 10 either inside or outside the circular area 67. Accordingly, within the area 67, the concentration of lithium atoms on the surface is maximum and substantially uniform and beyond this area the concentration of lithium atoms tapers off in a direction radially outward from the axis 17 (FIG. 1). The rate of decrease of dope concentration on the surface 12 of the semiconductor wafer 10 with increasing distance beyond the area 67 is a function of the reflection coefficient of the wall of the tube 64 and of the overall geometry. Preferably, the tube 64 has a high coefficient of reflection, and it may be fabricated of a metal such for example as copper.

If the coefficient of reflection is known, a geometry sufficient to produce a desired concentration of lithium atoms as a function of location on the wafer 10 can be calculated. In practice, however, it is generally more convenient to determine the appropriate geometry empirically. It has been found in this manner that a copper tube at about 40° C. having an internal diameter of 8 millimeters and a length of 30 millimeters when inserted between a lithium source 40 millimeters from the semiconductor wafer with its mouth 4 millimeters from the semiconductor wafer produces an area of maximum lithium concentration having a diameter of about 9 millimeters.

The semiconductor wafer 10 is preferably maintained at an elevated temperature, say about 400° C., by a hotplate 70 during the evaporation of the lithium from the boat 52 so that diffusion of the lithium into the wafer 10 occurs simultaneously with the evaporation and deposition of the lithium onto the surface 12 of the semiconductor wafer 10. The diffusion of lithium into silicon may occur over a widely ranging period. In one particular case, the period was about 30 seconds. Where other parameters are varied, the diffusion period may be adjusted as necessary, as those skilled in the art will understand. After the diffusion, the semiconductor wafer 10 is cooled quickly by, for example, its exposure to air at room temperature. The wafer 10 may be removed from the hotplate 70 when the interior of the bell jar 62 reaches atmospheric pressure.

Thus there is provided in accordance with the invention novel and highly effective semiconductors which have improved reverse-bias characteristics rendering them superior to conventional devices in a wide variety of applications including, significantly, radiation detectors and novel and highly effective methods and apparatus facilitating manufacture of the improved semiconductors.

The representative embodiments described above are susceptible of many modifications within the spirit and scope of the invention. For example, while the exemplary semiconductors described above are in the form of generally disk-shaped wafers, semiconductor devices of other shapes can also be employed. If the semiconductor employed is in the shape of a torus and the I region is annular, a tapered shelf on the inner periphery of the I region may be provided in addition to the tapered shelf on the outer periphery. The shelf on the inner periphery in such case tapers from a maximum thickness at the location where it adjoins the remainder of the I region to a minimum thickness remote from such location and radially closer to the axis of the torus; and the lithium is deposited relatively heavily in a circular path and progressively more lightly in directions towards and away from the center of the circular path. A pair of concentric cylinders may be employed to facilitate deposition through an annular passage therebetween in the desired concentrations. Further, while the invention is specifically disclosed with respect to silicon, it may also, with appropriate adjustment of temperature and other parameters, be used with germanium or other semiconductors.

In addition, while the specific embodiments of the invention described in detail above relate to the diffusion and drifting of an N-type-including dope in an intially P-type semiconductor, the principle is also applicable to the case where a P-type-inducing dope is diffused and drifted in an initially N-type semiconductor or where N-type-inducing dope and P-type-inducing dope are diffused respectively into opposite faces of an initially intrinsic semiconductor to form a P-N or P-I-N device.

Further, the resistivity of the base crystal may vary widely. In the case of silicon, the range may be from 200 to 2,000 ohm-centimeters, for example. Many other modifications will occur to those skilled in the art.

Accordingly, the invention is to be construed as extending to all modifications thereof within the scope of the appended claims.

I claim:

1. In a radiation detection system including (a) a semiconductor having a P region, an N region, and a third region between said P and N regions, said third region being formed with an annular shelf and being responsive to radiation, (b) means for applying reverse bias to said semiconductor, and (c) means for measuring a pulse generated in response to radiation impinging on said semiconductor, the improvement wherein said shelf tapers from a maximum thickness at the portion thereof adjoining the remainder of said third region to a minimum thickness which is essentially zero at the portion thereof remote from the remainder of said third region.

References Cited

UNITED STATES PATENTS

| | | | |
|---|---|---|---|
| 3,413,529 | 11/1968 | Goulding | 317—234 |
| 3,311,759 | 3/1967 | Rouse | 307—88.5 |
| 3,351,758 | 11/1967 | Armantrout | 250—83.3 |

JOHN W. HUCKERT, Primary Examiner

M. H. EDLOW, Assistant Examiner

U.S. Cl. X.R.

250—83.3; 317—235